(12) United States Patent
Choi et al.

(10) Patent No.: US 10,239,161 B2
(45) Date of Patent: Mar. 26, 2019

(54) STAGE FOR CUTTING SUBSTRATE AND SUBSTRATE-CUTTING APPARATUS

(71) Applicant: Samsung Display Co., Ltd., Yongin-si, Gyeonggi-do (KR)

(72) Inventors: Wonwoo Choi, Yongin-si (KR); Seungho Yoon, Yongin-si (KR); Sangbong Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 447 days.

(21) Appl. No.: 15/192,910

(22) Filed: Jun. 24, 2016

(65) Prior Publication Data

US 2017/0120379 A1    May 4, 2017

(30) Foreign Application Priority Data

Oct. 29, 2015    (KR) ........................ 10-2015-0151095

(51) Int. Cl.
| | |
|---|---|
| *B23K 26/142* | (2014.01) |
| *B23K 26/38* | (2014.01) |
| *B23K 26/402* | (2014.01) |
| *H01L 21/67* | (2006.01) |
| *H01L 21/68* | (2006.01) |
| *H01L 21/78* | (2006.01) |
| *H01L 21/683* | (2006.01) |
| *B23K 37/04* | (2006.01) |
| *B23K 26/08* | (2014.01) |
| *B25B 11/00* | (2006.01) |
| *B23K 26/082* | (2014.01) |
| *B23K 26/0622* | (2014.01) |

(Continued)

(52) U.S. Cl.
CPC ........ *B23K 26/402* (2013.01); *B23K 26/0622* (2015.10); *B23K 26/082* (2015.10); *B23K 26/0876* (2013.01); *B23K 26/38* (2013.01); *B23K 37/0408* (2013.01); *B25B 11/005* (2013.01); *H01L 21/67092* (2013.01); *H01L 21/6838* (2013.01); *B23K 2101/42* (2018.08); *B23K 2103/56* (2018.08)

(58) Field of Classification Search
CPC ........ B23K 26/14; B23K 26/38; B23K 26/40; H01L 21/67; H01L 21/78; H01L 21/68
USPC ........................................ 219/121.67–121.72
See application file for complete search history.

(56) References Cited

U.S. PATENT DOCUMENTS

| | | | | |
|---|---|---|---|---|
| 2003/0006219 | A1* | 1/2003 | Miller | H02G 1/128 219/121.68 |
| 2004/0159637 | A1* | 8/2004 | Herke | B23K 26/0846 219/121.18 |
| 2007/0109521 | A1 | 5/2007 | Nishii et al. | |

FOREIGN PATENT DOCUMENTS

| | | |
|---|---|---|
| JP | 2008-137016 A | 6/2008 |
| JP | 2013-111644 A | 6/2013 |

(Continued)

*Primary Examiner* — Samuel M Heinrich
(74) *Attorney, Agent, or Firm* — Lewis Roca Rothgerber Christie LLP

(57) ABSTRACT

Provided are a stage for cutting a substrate and a substrate-cutting apparatus. The stage for cutting a substrate includes: a plurality of cell areas, each of the cell areas including a first opening; an edge area at an outer side of the cell areas, the edge area including a second opening having a diameter that is larger than a diameter of the first opening; a dummy area between adjacent ones of the cell areas; and a cutting groove between one of the adjacent ones of the cell areas and the dummy area or between one of the cell areas and the edge area.

20 Claims, 9 Drawing Sheets

(51) Int. Cl.
*B23K 103/00* (2006.01)
*B23K 101/42* (2006.01)

(56) References Cited

FOREIGN PATENT DOCUMENTS

| | | |
|---|---|---|
| KR | 10-2007-0013759 A | 1/2007 |
| KR | 10-2012-0016946 A | 2/2012 |
| KR | 10-2013-0021756 A | 3/2013 |
| KR | 10-2015-0031456 A | 3/2015 |
| WO | WO 2013/100149 A1 | 7/2013 |

\* cited by examiner

STAGE FOR CUTTING SUBSTRATE AND SUBSTRATE-CUTTING APPARATUS

CROSS-REFERENCE TO RELATED APPLICATION

This application claims priority to and the benefit of Korean Patent Application No. 10-2015-0151095, filed on Oct. 29, 2015 in the Korean Intellectual Property Office, the entire disclosure of which is incorporated herein by reference.

BACKGROUND

1. Field

One or more embodiments relate to a method and apparatus for cutting a substrate.

2. Description of the Related Art

Generally, examples of display devices include organic light-emitting displays, liquid crystal displays (LCDs), electrophoretic displays (EDs), surface-conduction electron-emitter displays (SEDs), vacuum fluorescent displays (VFDs), etc.

Display apparatuses may be used in mobile devices, such as smartphones, tablet personal computers, laptop computers, digital cameras, camcorders, and personal digital assistants (PDAs), or in electronic products, such as slim televisions, displays, and advertisement panels.

Recently, research into manufacturing slimmer display apparatuses has been conducted. Among the display apparatuses, flexible display apparatuses, which are portable and can be applied to devices having various shapes, have drawn attention as next-generation display apparatuses. For example, flexible display apparatuses using organic light-emitting displays have been researched.

Display apparatuses may undergo a cutting process. During the cutting process, impurities generated by cutting a substrate should be removed.

Information disclosed in this Background section was known to the inventors before achieving the inventive concept or is technical information acquired in the process of achieving the inventive concept. Therefore, it may contain information that does not form the prior art that is already known to a person of ordinary skill in the art.

SUMMARY

One or more embodiments include a stage for cutting a substrate and a substrate-cutting apparatus that improve productivity of manufacturing display apparatuses by effectively removing impurities generated during substrate cutting and reducing or minimizing contamination of the substrate.

Additional aspects will be set forth, in part, in the description which follows and, in part, will be apparent from the description or may be learned by practice of the presented embodiments.

According to one or more embodiments, a stage for cutting a substrate includes: a plurality of cell areas, each of the cell areas including a first opening; an edge area at an outer side of the cell areas, the edge area including a second opening having a diameter that is larger than a diameter of the first opening; a dummy area between adjacent ones of the cell areas; and a cutting groove between one of the adjacent ones of the cell areas and the dummy area or between one of the cell areas and the edge area.

The stage may further include discharge line connected to the cutting groove, and the discharge line may be configured to discharge impurities from the cutting groove.

The cutting groove may be at opposite sides of the dummy area.

The discharge line may extend along the cutting groove and may be at an outer side of each of the cell areas.

The stage may further include: a first suction space connected to the first opening at a side of the cell areas; and a second suction space connected to the second opening at a side of the edge area.

The discharge line may be separated from the first suction space and the second suction space.

The dummy area may include a third opening, and the third opening may have a diameter that is larger than the diameter of the first opening and smaller than the diameter of the second opening.

The stage may further include a third suction space connected to the third opening at a side of the dummy area.

The edge area may further include: a first slit extending along an outer side of the cell areas; and a second slit extending toward an outer side of the first slit.

An edge of at least one of the cell areas may be devoid of a first opening.

According to one or more embodiments, a substrate-cutting apparatus includes: a stage for accommodating a substrate; and a laser module for irradiating a laser beam onto the substrate. The stage includes: a plurality of cell areas, each of the cell areas including a first opening; an edge area at an outer side of the cell areas, the edge area including a second opening having a diameter that is larger than a diameter of the first opening; a dummy area between adjacent ones of the cell areas; and a cutting groove between one of the adjacent ones of the cell areas and the dummy area or between one of the cell areas and the edge area. The laser beam is irradiated onto the substrate along the cutting groove.

The stage may further include a discharge line connected to the cutting groove, and the discharge line may be configured to discharge impurities generated when the laser module irradiates the laser beam onto the substrate.

The cutting groove may be at opposite sides of the dummy area.

The discharge line may extend along the cutting groove and may be at an outer side of each of the cell areas.

The substrate-cutting apparatus may further include: a first suction space connected to the first opening at a side of the cell areas; and a second suction space connected to the second opening at a side of the edge area.

The discharge line may be separated from the first suction space and the second suction space.

The dummy area may include a third opening, and the third opening may have a diameter that is larger than the diameter of the first opening and smaller than the diameter of the second opening.

The substrate-cutting apparatus may further include a third suction space connected to the third opening at a side of the dummy area.

The edge area may further include: a first slit extending along an outer side of the cell areas, and a second slit extending toward an outer side of the first slit.

An edge of at least one of the cell areas may be devoid of a first opening.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
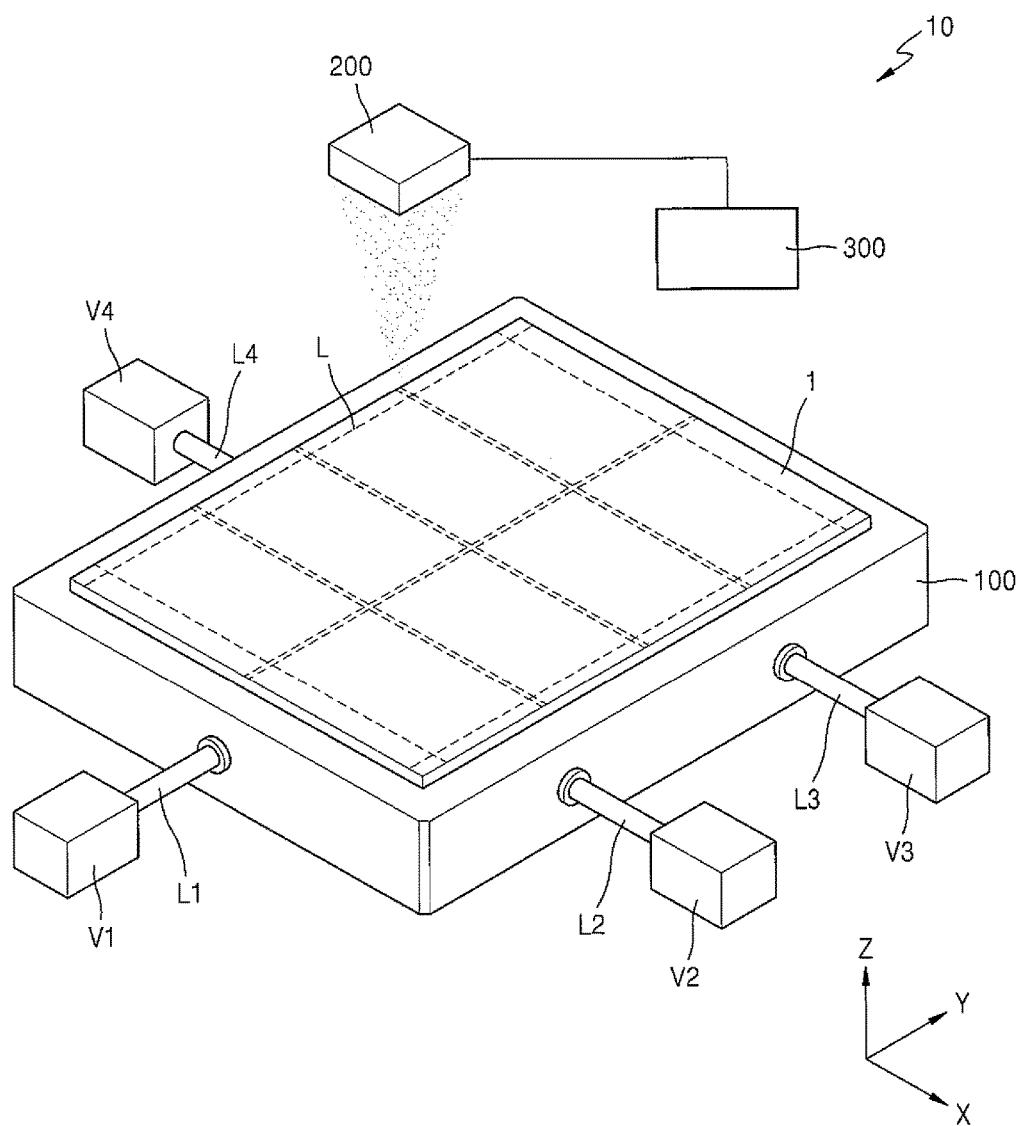
FIG. 1 is a perspective view of a substrate-cutting apparatus according to an embodiment.

Reference will now be made in detail to embodiments, examples of which are illustrated in the accompanying drawings. The presented embodiments may have different forms and should not be construed as being limited to the descriptions set forth herein. Accordingly, exemplary embodiments are merely described below, by referring to the figures, to explain aspects of the present description. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. And, as used herein, the terms "use," "using," and "used" may be considered synonymous with the terms "utilize," "utilizing," and "utilized," respectively.

Hereinafter, the same reference numerals refer to identical or substantially similar elements, and repetitive descriptions thereof may be omitted. Sizes of elements in the drawings may be exaggerated for convenience of explanation, and, because sizes and thicknesses of components in the drawings may be arbitrarily illustrated for convenience of explanation, the following embodiments are not limited thereto.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the singular forms "a" and "an" are intended to include the plural forms as well, unless the context clearly indicates otherwise. It will be further understood that the terms "includes," "including," "comprises," and/or "comprising" used herein specify the presence of stated features or components but do not preclude the presence or addition of one or more other features or components.

It will be understood that when an element or layer is referred to as being "on," "formed on," "connected to," or "coupled to" another element or layer, it may be directly on, formed on, connected, or coupled to the other element or layer or one or more intervening elements or layers may also be present. When an element is referred to as being "directly on," "directly formed on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the following examples, the x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

The controller and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the controller may be formed on one integrated circuit (IC) chip or on separate IC chips. Further, the various components of the controller may be implemented on a flexible printed circuit film, a tape carrier package (TCP), a printed circuit board (PCB), or formed on a same substrate as the controller. Further, the various components of the controller may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

When a certain embodiment can be implemented differently, a specific process order may be performed differently from the described order. For example, two consecutively described processes may be performed substantially at the same time (e.g., concurrently) or performed in an order opposite to the described order.

FIG. 1 is a perspective view of a substrate-cutting apparatus 10 according to an embodiment.

Referring to FIG. 1, the substrate-cutting apparatus 10 may include a stage 100 onto which a substrate 1 is loaded, a laser module 200 (e.g., a laser) above the stage 100, and a controller 300 for controlling the laser module 200.

The substrate 1 may be loaded onto the stage 100 for cutting. The stage 100 may include a first suction unit V1 (e.g., a first vacuum or a first pump) connected to a first inhalation line L1 (e.g., a first vacuum line), a second suction unit V2 (e.g., a second vacuum or a second pump) connected to a second inhalation line L2 (e.g., a second vacuum line), a third suction unit V3 (e.g., a third vacuum or a third pump) connected to a third inhalation line L3 (e.g., a third vacuum line), and a fourth suction unit V4 (e.g., a fourth vacuum or a fourth pump) connected to a fourth inhalation line L4 (e.g., a fourth vacuum line). Further descriptions of these components will be given below.

The laser module 200 may include a laser beam generator for emitting a laser beam and an optical system (e.g., a lens) in (e.g., aligned with) a path of the laser beam. The laser beam generator may include a solid-state laser, such as a ruby laser, a glass laser, an yttrium aluminum garnet (YAG) laser, an yttrium lithium fluoride (YLF) laser, etc., a gas-state laser, such as an excimer laser, a helium (He)-neon (Ne) laser, etc., or a pulsed laser.

The optical system may be located in a path of the laser beam generated by the laser beam generator. The optical system may include a homogenizer for uniformizing a shape of the laser beam or a condensing lens for focusing the laser beam. The laser beam may be changed into a certain shape, such as a line, a quadrangle, etc., by penetrating or passing through the optical system.

Also, the optical system may include one or more mirrors mounted in the path of the laser beam such that the mirrors change an angle or direction of the laser beam. The mirrors may include a galvano mirror, which may linearly change or adjust the angle according to an input voltage, or a reflection mirror.

The controller 300 may control a location of (e.g., movement of) the laser module 200 and/or a strength and an intensity of the emitted laser beam. The controller 300 may move the laser module 200 such that the laser beam is irradiated onto the substrate 1 along a cutting groove unit 140 (e.g., a cutting groove or cutting groove area) of the stage 100. The laser module 200 may move along an x axis and a y axis.

Also, the controller 300 may adjust the strength of the laser beam such that the laser beam is able to cut the substrate 1. The controller 300 may control the strength and the intensity of the laser beam emitted from the laser beam generator according to certain (e.g., predetermined or stored) values or according to values inputted by an operator.

Figure 2:
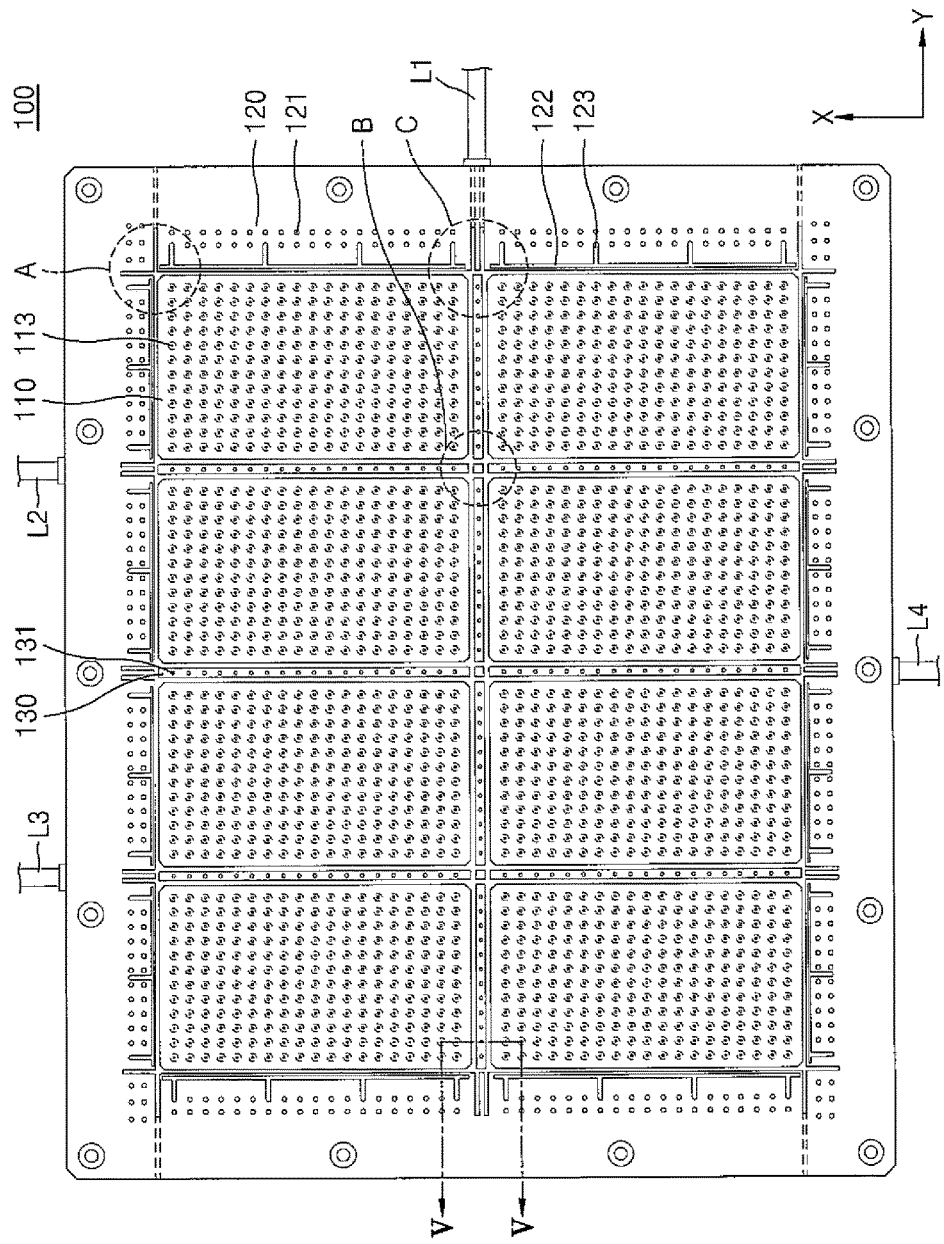
FIG. 2 is a plan view of a stage for cutting a substrate shown in FIG. 1.
Figure 3:
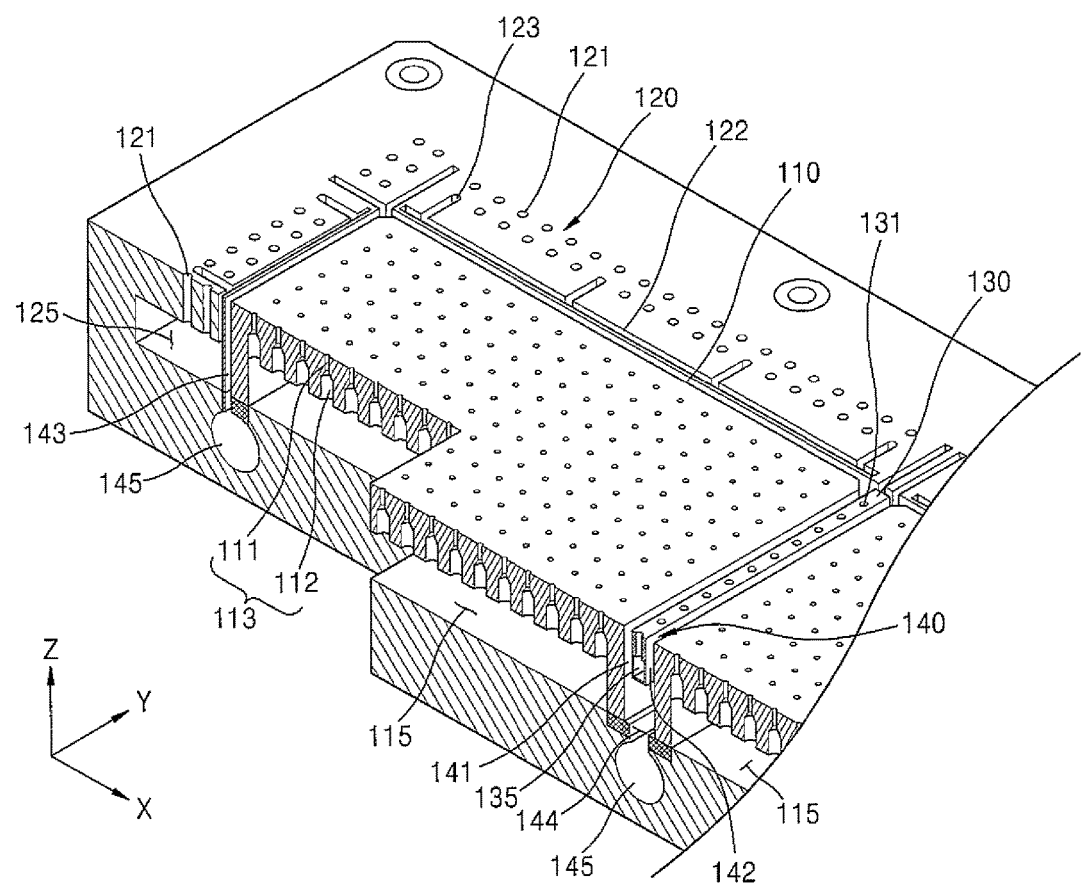
FIG. 3 is a perspective view of a partial plane of the stage for cutting a substrate shown in FIG. 2.
Figure 4A:
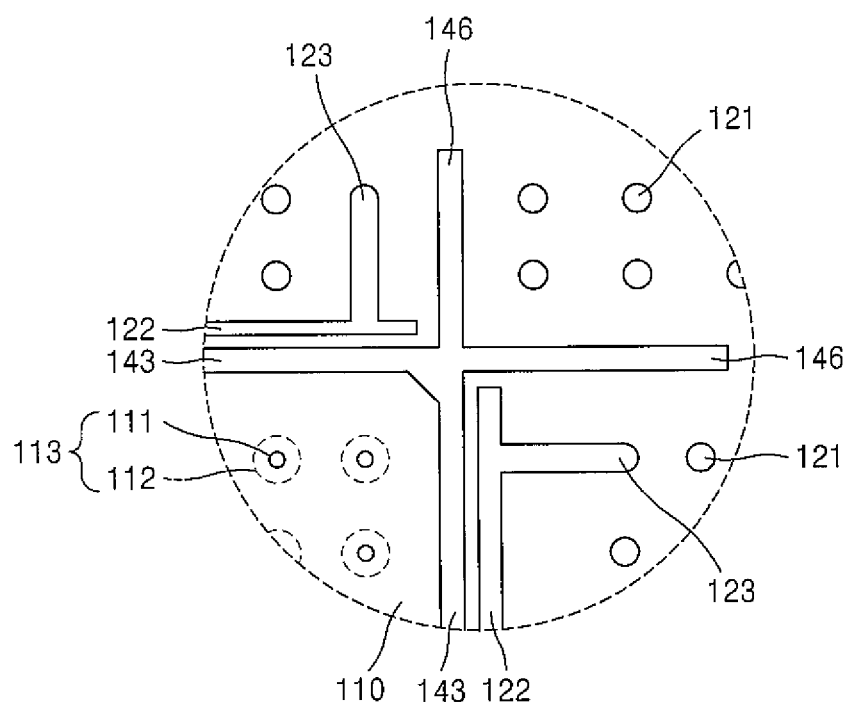
FIG. 4A is an enlarged view of the area A of FIG. 2.
Figure 4B:
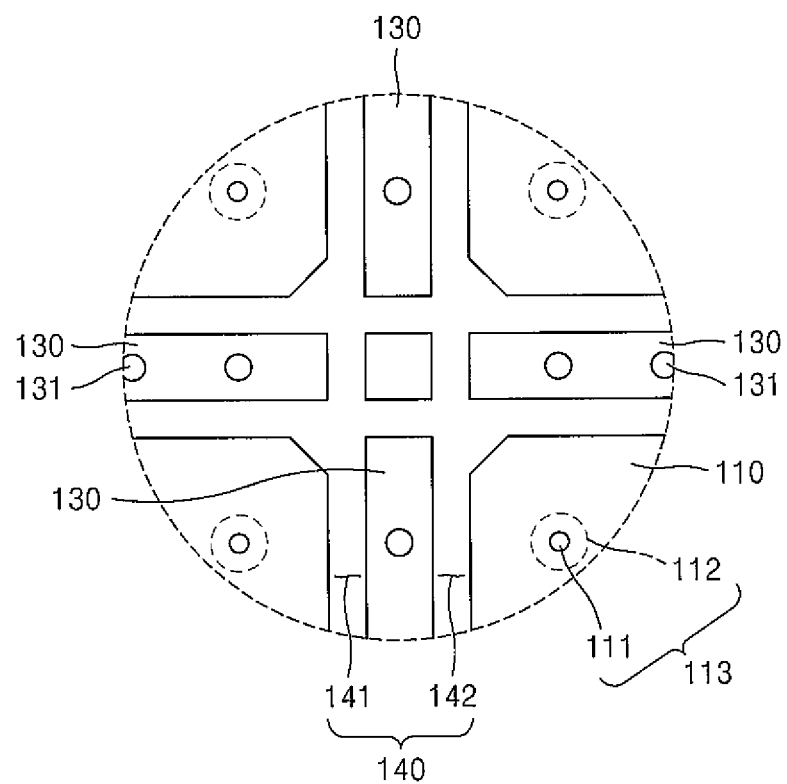
FIG. 4B is an enlarged view of the area B of FIG. 2.
Figure 4C:
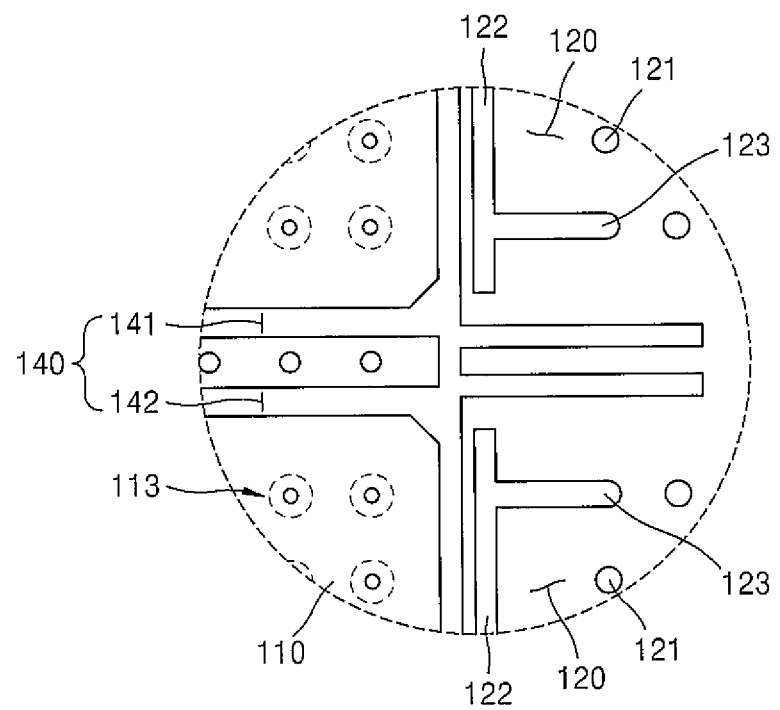
FIG. 4C is an enlarged view of the area C of FIG. 2.
Figure 5:
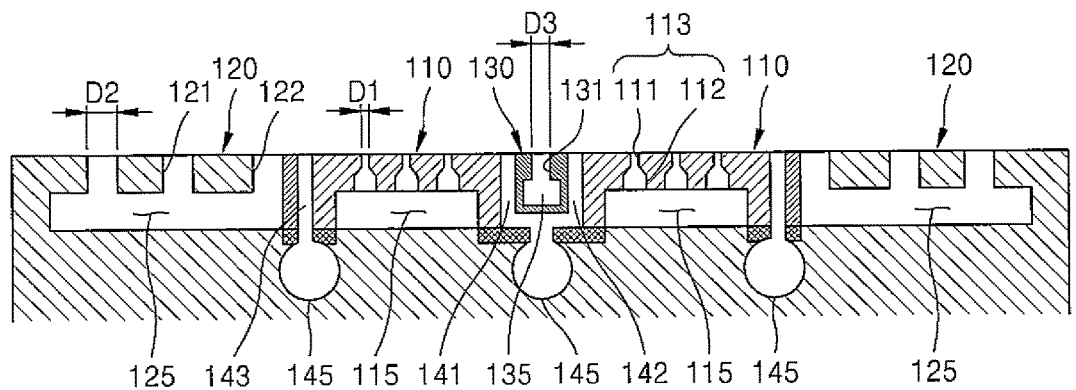
FIG. 5 is a cross-sectional view taken along the line V-V of FIG. 2.

FIG. 2 is a plan view of the stage for cutting the substrate 1 shown in FIG. 1. FIG. 3 is a perspective view of a partial plane of the stage for cutting the substrate 1 shown in FIG. 2. FIG. 4A is an enlarged view of the area A of FIG. 2, FIG. 4B is an enlarged view of the area B of FIG. 2, and FIG. 4C is an enlarged view of the area C of FIG. 2. FIG. 5 is a cross-sectional view taken along the line V-V of FIG. 2.

Referring to FIGS. 2 through 5, the stage for cutting the substrate 1 may include a cell area 110, an edge area 120, a dummy area 130, and the cutting groove unit 140.

The stage 100 may include a plurality of the cell areas 110. The number of cell areas 110 is not limited and may be varied and/or selected depending on the size of the substrate 1. However, hereinafter, for convenience of explanation, an embodiment in which the stage 100 includes eight cell areas 110 will be described as an example.

Each cell area 110 is an area of the stage 100 at which a portion of the substrate 1, which is to be cut to be used in a display apparatus, is suctioned to the stage 100. The cell areas 110 may have a plurality of first openings 113. The number of first openings 113 is not limited and may be determined according to a size of the cut substrate (e.g., a portion of the substrate 1 to be cut).

The first opening 113 may include a first end 111, which opens to a surface of the stage 100, and a second end 112, which opens to a first suction portion 115 (e.g., a first suction space). A diameter of the first end 111 may be smaller than a diameter of the second end 112 (e.g., the first opening 113 may be tapered or have a taper shape). The first end 111 may be formed to have a smaller diameter than the second end 112 in order to function as a suction nozzle. By having a smaller diameter than the second end 112, the first end 111 may securely suction the substrate 1 onto the stage 100.

Also, because the diameter of the first end 111 is smaller than the diameter of the second end 112, when the substrate 1 is suctioned to the cell area 110, contact contamination, including scratches, bending, folding, etc., occurring on the substrate 1 due to the suction may be reduced.

The first suction portion 115 may be positioned below (e.g., may extend under) the plurality of cell areas 110. The first suction portion 115 is connected to the second inhalation line L2. The second inhalation line L2 is connected to the second suction unit V2. Thus, when the second suction unit V2 is driven, the second suction unit V2 removes (e.g., inhales) air from the first suction portion 115 and the first opening 113. Thus, the substrate 1 may be suctioned to the stage 100 at the first opening 113.

Each of the plurality of cell areas 110 may include the first suction portion 115. The plurality of first suction portions 115 may be connected to each other via a manifold, and the manifold may be connected to the second suction unit V2. Suction power at the first suction portion 115 (e.g., the internal pressure in the first suction portion 115) may be adjusted via the second suction unit V2. In another embodiment, each of the first suction portions 115 may be connected to the second suction unit V2.

The edge area 120 may be located outside of (e.g., may surround) the plurality of cell areas 110. A portion of the loaded substrate 1 (e.g., the portion of the substrate 1 to be removed by a laser beam) is suctioned to the edge area 120.

The edge area 120 may include a second opening 121, a first slit 122, and a second slit 123. The second opening 121, the first slit 122, and the second slit 123 are connected to (e.g., are in communication with) a second suction portion 125 (e.g., a second suction space).

Multiple second openings 121 may be located in the edge area 120. A diameter of the second opening 121 may be larger than a diameter of the first opening 113. For example, the diameter of the second opening 121 may be larger than the diameter of the first end 111 of the first opening 113. The second opening 121 may be formed to have a diameter larger than that of the first opening 113 to increase suction of the substrate 1 to the stage 100 at the edge area 120. Because the portion of the substrate 1 which is suctioned to the edge area 120 is removed during a substrate cutting process, the diameter of the second opening 121 may be relatively large. The second opening 121 having a relatively large diameter increases suction power, which may prevent twisting or shaking of the substrate 1 when the substrate 1 is cut by a laser beam.

The first slit 122 may be located along an outer side of (e.g., may surround) the cell areas 110. The first slit 122 may be formed in an area of the edge area 120 that is adjacent to the cell areas 110 and may extend along the outer side of the cell areas 110. The first slit 122 may allow the substrate 1 to adhere to the edge area 120, which is adjacent to the cutting groove unit 140.

The first slit 122 extends parallel to the cutting groove unit 140 and has a relatively large opening which may increase suction of the substrate 1 at the edge area 120. Thus, when the substrate 1 is cut by a laser beam, twisting or shaking of the substrate 1 may be reduced or prevented so that the process of cutting the substrate 1 may be precisely performed.

The second slit 123 may extend from the first slit 122. The second slit 123 may allow the substrate 1 to adhere to the stage 100 in the area adjacent to the cutting groove unit 140.

The second suction portion 125 may be connected to the second opening 121, the first slit 122, and the second slit 123 (e.g., each of the second opening 121, the first slit 122, and the second slit 123 may be in communication with the second suction portion 125). The second suction portion 125 may be located below (e.g., may extend under) the edge area 120. The second suction portion 125 is connected to the third inhalation line L3. The third inhalation line L3 is connected to the third suction unit V3. Thus, when the third suction unit V3 is driven, the third suction unit V3 removes air from the second suction portion 125, the second opening 121, the first slit 122, and the second slit 123. Thus, the substrate 1 may be suctioned to the stage 100 at the second opening 121, the first slit 122, and the second slit 123.

The edge area 120 may be divided into a plurality of sections, and each section of the edge area 120 may include the second suction portion 125. The second suction portions 125 may be connected to each other. Suction power at the second suction portion 125 may be adjusted via the third suction unit V3. Each of the second suction portions 125 may also be connected to the third suction unit V3, which controls the suction power at each of the second suction portions 125.

Also, the edge area 120 may form a flow path circulating along an outer portion of the stage 100. For example, the edge area 120 may not be divided into a plurality of sections, and the second suction portion 125 may be formed as one flow path. In one embodiment, the second suction portion 125 may be connected to the third suction unit V3. Suction power at the edge area 120 may be adjusted via the third suction unit V3.

The dummy area 130 may be between the plurality of cell areas 110. The dummy area 130 may be between one of the cell areas 110 and another one of the cell areas 110 adjacent to the one cell area 110. The number of dummy areas 130 is not limited and may be changed or varied depending on the number of cell areas 110. The stage 100 shown in FIG. 2 includes ten dummy areas 130. However, the present invention is not limited thereto. For example, when the number of cell areas 110 is increased, the number of dummy areas 130 may increase, and when the number of cell areas 110 is decreased, the number of dummy areas 130 may decrease.

The portion of the substrate 1 which is suctioned to the dummy area 130 is a margin area and is removed using a laser beam. The margin area increases the quality of a cut surface of the substrate 1.

The cutting groove unit 140 may be located at both sides of (e.g., at opposite sides of) the dummy area 130. When the laser beam moves along the cutting groove unit 140, the portion of the substrate 1 corresponding to the dummy area 130 may be cut away from or separated from other portions of the substrate 1.

The dummy area 130 may have a third opening 131. A plurality of third openings 131 may be located at the dummy area 130. The third openings 131 may be arranged along a length direction of the dummy area 130. A diameter of the third opening 131 may be larger than the diameter of the first opening 113 and smaller than the diameter of the second opening 121.

The third opening 131 may increase suction of the substrate 1 to the dummy area 130. Such increased suction of the substrate 1 to the dummy area 130 may reduce or prevent twisting and shaking of the substrate 1 when the substrate 1 is cut by a laser beam. Accordingly, the substrate cutting process may be precisely performed.

A third suction portion 135 (e.g., a third suction space) may be connected to (e.g., may communicate with) the third opening 131. The third suction portion 135 may be located below (e.g., may extend below) the dummy area 130. The third suction portion 135 is connected to the fourth inhalation line L4. The fourth inhalation line L4 is connected to the fourth suction unit V4. Thus, when the fourth suction unit V4 is driven, the fourth suction unit V4 removes air from the third suction portion 135 and the third opening 131. Thus, the substrate 1 may be suctioned to the stage 100 at the third opening 131.

Each of the plurality of dummy areas 130 may include the third suction portion 135. The third suction portions 135 may be connected to each other via a manifold, and the manifold may be connected to the fourth suction unit V4. Suction power at the third suction portion 135 may be adjusted via the fourth suction unit V4. In another embodiment, each of the third suction portions 135 may be connected to the fourth suction unit V4.

The cutting groove unit 140 may be a path for a laser beam emitted from the laser module 200. The cutting groove unit 140 may be between the cell area 110 and the dummy area 130 and/or between the cell area 110 and the edge area 120.

In the cutting groove unit 140 between the cell area 110 and the dummy area 130, a first groove 141 and a second groove 142 may be located along both sides of (e.g., opposite sides of) the dummy area 130. When the laser beam is irradiated onto the first groove 141 and the second groove 142, the substrate 1 may be divided into cell portions, which are used in a product, and portions of the substrate 1 that are between the cell portions are removed. The first groove 141 and the second groove 142 may be connected to (e.g., may communicate with) a discharge line 145 through a connection unit 144 (e.g., a connector or opening).

A third groove 143 may be between the cell area 110 and the edge area 120. When the laser beam is irradiated onto the third groove 143, the substrate 1 may be divided into cell portions and outer portions. The cell portions may be used in a product, and the outer portions may be removed. The third groove 143 is connected to (e.g., communicates with) the discharge line 145.

The discharge line 145 may be connected to the cutting groove unit 140 and may discharge impurities from the cutting groove unit 140. The discharge line 145 may be formed below (e.g., may extend under) each of the plurality of cell areas 110 along the cutting groove unit 140.

The discharge line 145 may be separated from the first suction portion 115, the second suction portion 125, and the third suction portion 135 in order to prevent impurities in the discharge line 145 from flowing into the cell areas 110, the edge area 120, and the dummy area 130.

The discharge line 145 may be connected to the first suction unit V1 via the first inhalation line L1. When the first suction unit V1 operates, the impurities in the cutting groove unit 140 may be gathered in the discharge line 145 and may be collected in a dust collector of the first suction unit V1.

The first suction unit V1 is a device for removing air or impurities from the discharge line 145. For example, the first suction unit V1 may include a solenoid valve for adjusting an opening, a vacuum pump for providing suction power, and a dust collector for storing collected impurities.

Referring to FIGS. 4A and 4C, the cutting groove unit 140 may include an extension groove 146 extending into the edge area 120. The extension groove 146 may provide further movement space for the laser beam, and thus, the substrate cutting process may be more easily performed. Referring to FIG. 4B, the dummy area 130 may form a + shape at an area in which four adjacent cell areas 110 meet with one another.

Referring to FIG. 5, relative sizes of the first opening 113, the second opening 121, and the third opening 131 are illustrated.

A diameter D1 of the first opening 113 may be smaller than a diameter D2 of the second opening 121 and smaller than a diameter D3 of the third opening 131. The relatively small diameter D1 of the first opening 113 may reduce or prevent damage (e.g., scratching, bending, folding, etc.) to the substrate 1, which may occur due to the suction from the first suction portion 115 when the substrate 1 is adhered to the stage 100. When the first opening 113 has the relatively small diameter D1, the quality of the substrate 1 which adheres to the cell area 110 may increase.

The diameter D2 of the second opening 121 may be larger than the diameter D1 of the first opening 113 and larger than the diameter D3 of the third opening 131. The second opening 121 may have a relatively large diameter D2 such that an edge of the substrate 1 adheres to the stage 100 when air is suctioned from the second suction portion 125. When the diameter D2 of the second opening 121 is larger than the diameter D1 of the first opening 113 and the diameter D3 of the third opening 131, the edge of the substrate 1 may be fixed to the stage 100 so that twisting or shaking of the substrate 1 may be reduced or prevented during the process of cutting the substrate 1.

The diameter D3 of the third opening 131 may be larger than the diameter D1 of the first opening 113. However, the diameter D3 of the third opening 131 may be smaller than the diameter D2 of the second opening 121. The diameter D3 of the third opening 131 may be larger than the diameter D1 of the first opening 113 in order to ensure that the portion of the substrate 1 at the dummy area 131 is suctioned to the stage 100. Also, the diameter D3 of the third opening 131 may be smaller than the diameter D2 of the second opening 121 so that a size of the substrate 1 that is cut in the dummy area 130 is reduced or minimized in order to reduce the material cut from the substrate 1.

The first opening 113 may suction the substrate 1 at a first suction power, the second opening 121 may suction the substrate 1 at a second suction power, and the third opening 131 may suction the substrate 1 at a third suction power. In one embodiment, the first suction power may be less than the second suction power or the third suction power. Also, the second suction power may be greater than the first suction power or the third suction power. Also, the third suction power may be greater than the first suction power and less than the second suction power.

Figure 6:
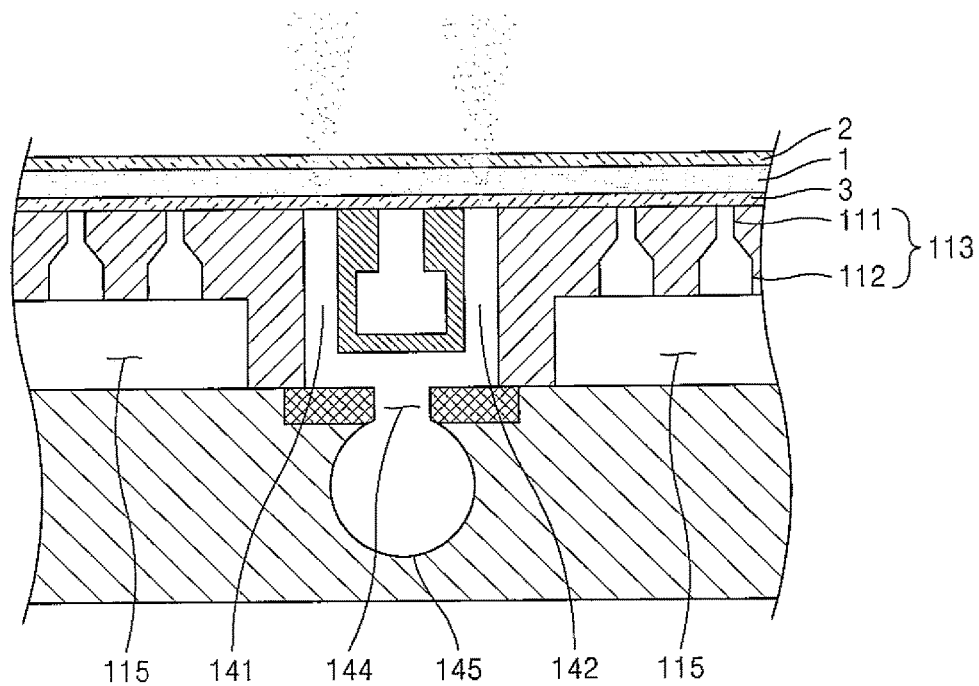
FIG. 6 is a cross-sectional view illustrating an operating state of the substrate-cutting apparatus shown in FIG. 1.

FIG. 6 is a cross-sectional view illustrating an operating state of the substrate-cutting apparatus 10 shown in FIG. 1.

Referring to FIGS. 3 and 6, a process of removing, via the discharge line 145, impurities generated when the substrate is cut will be further described below.

An upper protective film 2 is bonded on (e.g., bonded on an upper surface of) the substrate 1 on which a display unit and an encapsulation layer are formed, and a lower protective film 3 is bonded on a lower surface of the substrate 1. The upper protective film 2 and the lower protective film 3 may prevent the substrate 1 from being contaminated by external materials.

When the substrate 1 is loaded onto the stage 100, the cell areas 110 are suctioned via the second suction unit V2 connected to the first opening 113, and the edge area 120 is suctioned via the third suction unit V3 connected to the second opening 121, the first slit 122, and the second slit 123. The dummy area 130 is suctioned via the fourth suction unit V4 connected to the third opening 131.

When the laser module 200 emits a laser beam, the laser beam may move along the first groove 141 and the second groove 142 to cut the substrate 1. When the substrate 1, the upper protective film 2, and/or the lower protective film 3 is cut, impurities, such as fumes or particles, may be generated.

The impurities may pass through the first groove 141 and the second groove 142 and move to the discharge line 145. The discharge line 145 is connected to the first suction unit V1, and thus, the impurities may be collected in the first suction unit V1.

In the cut substrate 1, the upper protective film 2 and the lower protective film 3 may be removed and a color filter may be bonded on the substrate 1.

The discharge line 145 and the first suction unit V1 may remove the impurities generated during the substrate cutting process. Such removal of impurities may improve the production, durability, and reliability of the display apparatuses.

Figure 7:
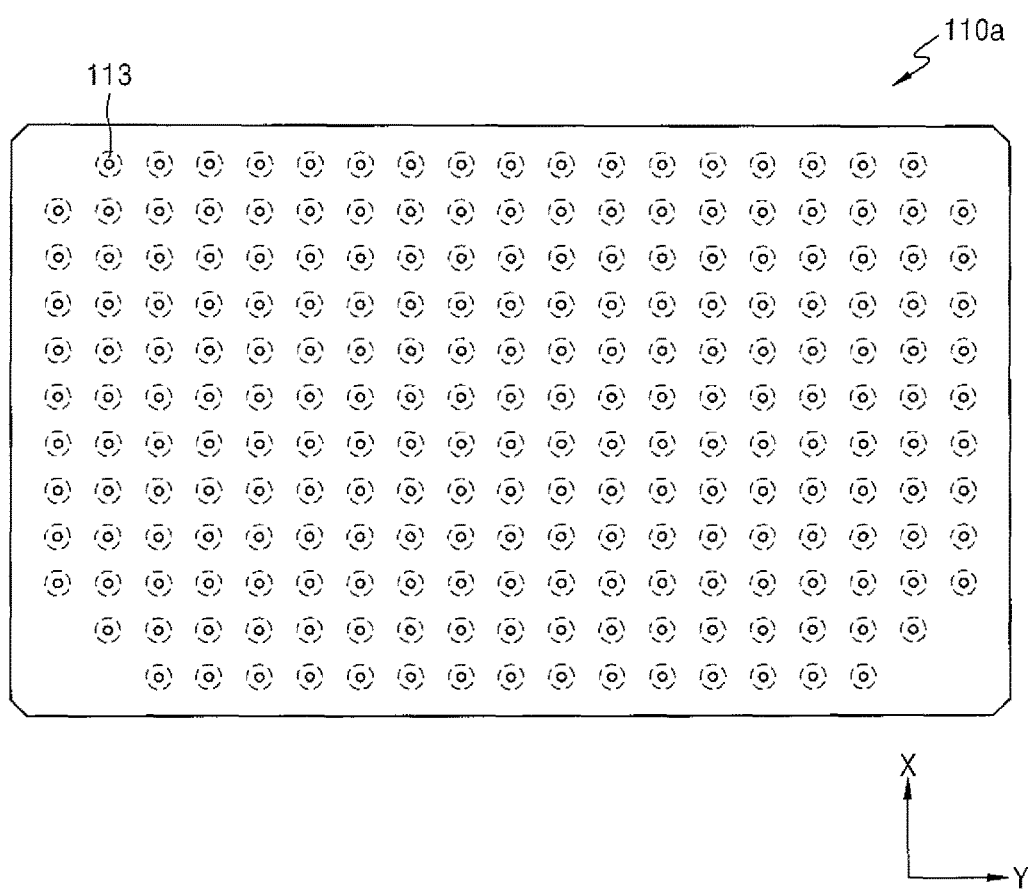
FIG. 7 is a plan view of a cell area of FIG. 2 according to another embodiment.

FIG. 7 is a plan view of a cell area 110a, similar to the cell area 110 shown in FIG. 2, according to another embodiment.

Referring to FIG. 7, the cell area 110a may be formed such that an edge of the cell area 110a does not include any first openings 113. An alignment mark or a quick response (QR) code may be included at a portion of the substrate 1 corresponding to the edge of the cell area 110a. To prevent the alignment mark or the QR code from being contaminated (e.g., distorted or deformed) due to one or more first openings 113, the edge of the cell area 110a may not include any first openings 113.

Figure 8:
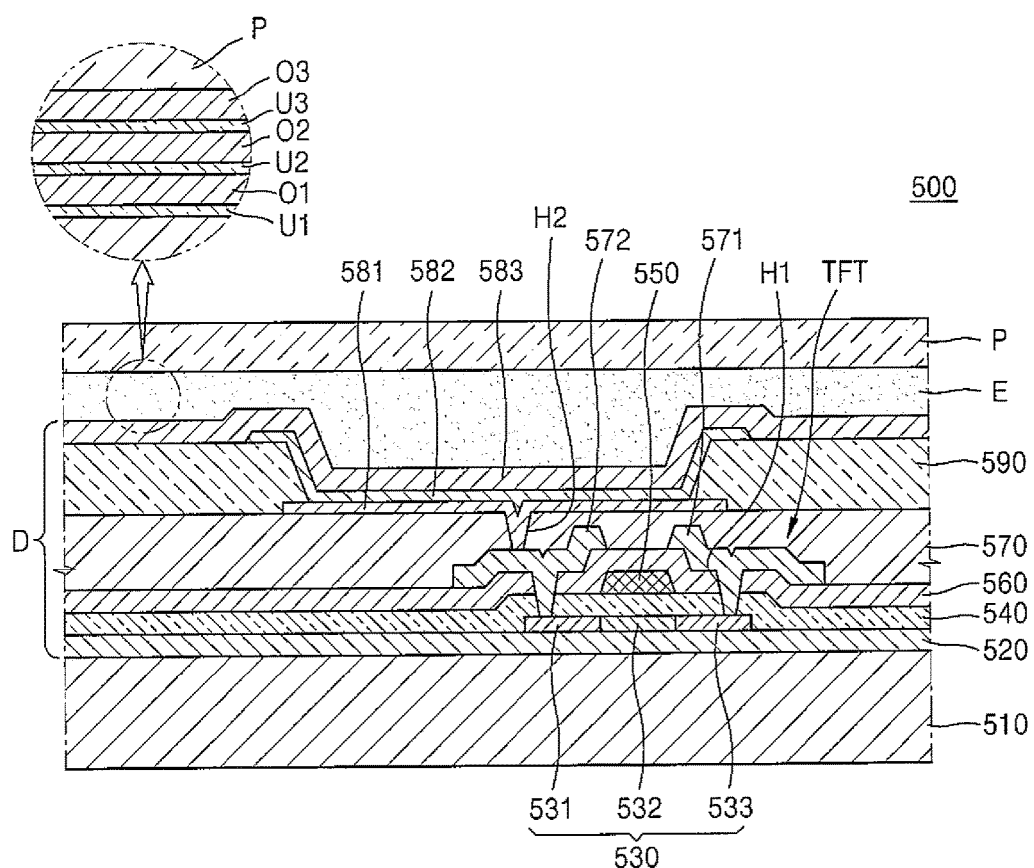
FIG. 8 is a cross-sectional view of a sub-pixel of a display apparatus manufactured by using the substrate-cutting apparatus shown in FIG. 1.

FIG. 8 is a cross-sectional view of a sub-pixel of a display apparatus 500 manufactured by using the substrate-cutting apparatus 10 shown in FIG. 1.

In one embodiment, the sub-pixels may include at least one thin film transistor (TFT) and an organic light-emitting device (OLED). The TFT is not limited to the structure illustrated in FIG. 8, and the number and structures thereof may vary. Referring to FIG. 8, the display apparatus 500 may include a substrate 510, a display unit D, an encapsulation unit E, and a protective layer P.

The substrate 510 may include a flexible insulating material. For example, the substrate 510 may include a polymer substrate including polyimide (PI), polycarbonate (PC), polyethersulfone (PES), polyethylene terephthalate (PET), polyethylene naphthalate (PEN), polyarylate (PAR), fiberglass reinforced plastic (FRP), etc.

According to one embodiment, the substrate 510 may include a glass substrate having a thickness that allows for bending (e.g., a flexible glass substrate). In another embodiment, the substrate 510 may include a metal material. The substrate 510 may be transparent, half-transparent, or non-transparent.

A buffer layer 520 including an organic compound and/or an inorganic compound may further be formed on the substrate 510. The buffer layer 520 may block oxygen and water and may planarize a surface of the substrate 510.

The buffer layer 520 may include an inorganic material, such as a silicon oxide ($SiO_x$), a silicon nitride ($SiN_x$), a silicon oxynitride ($SiO_xN_y$), an aluminum oxide ($AlO_x$), and an aluminum nitride ($Al_xN_y$), or an organic material, such as acryl, a polyimide, and polyester.

The TFT may be formed on the buffer layer 520. According to one embodiment, the TFT is a top-gate transistor. However, the TFT may include other structures and may be, for example, a bottom gate transistor.

After an active layer 530 is formed on the buffer layer 520 in a certain (e.g., predetermined) pattern, the active layer 530 is covered by a gate insulating layer 540. The active layer 530 may include a drain area 531, a source area 533, and a channel area 532 between the drain area 531 and the source area 533.

The active layer 530 may include various materials. For example, the active layer 530 may include an inorganic semiconductor material, such as amorphous silicon or crystalline silicon. As another example, the active layer 530 may include an oxide semiconductor. For example, the oxide semiconductor may include an oxide of a material from metal elements of groups 12, 13, and 14, such as zinc (Zn), indium (In), gallium (Ga), tin (Sn), cadmium (Cd), germanium (Ge), and hafnium (Hf), or a combination thereof. In the below-described embodiments, the active layer 530 includes amorphous silicon.

A gate electrode 550 corresponding to the active layer 530 and an interlayer insulating layer 560 covering the gate electrode 550 are formed on the gate insulating layer 540.

After a contact opening H1 (e.g., a contact hole) is formed in the interlayer insulating layer 560 and the gate insulating layer 540, and a source electrode 571 and a drain electrode 572 are formed on the interlayer insulating layer 560 to contact the source area 533 and the drain area 531, respectively.

A passivation layer 570 is formed on the TFT, and a pixel electrode 581 of the OLED is formed on the passivation layer 570.

The pixel electrode 581 may include a transparent electrode (e.g., a half or partially transparent electrode) or a reflection electrode. When the pixel electrode 581 is the transparent electrode, the pixel electrode 581 may include, for example, indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 581 is a reflection electrode, the pixel electrode 581 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof and a layer including ITO, IZO, ZnO, or $In_2O_3$. However, structures and materials of the pixel electrode 581 are not limited thereto and may vary.

The pixel electrode 581 contacts the drain electrode 572 of the TFT via an opening H2 (e.g., a via hole) formed in the passivation layer 570. The passivation layer 570 may include a single layer or may be a multi-layer structure including an inorganic material and/or an organic material. The passivation layer 570 may be formed as a planarization layer to planarize a layer below the passivation layer 570, wherein curvature of the layer below may vary. In another embodiment, the passivation layer 570 may be curved corresponding to the curvature of the layer below the passivation layer 570. The passivation layer 570 may include a transparent insulator in order to provide a resonance effect.

After the pixel electrode 581 is formed on the passivation layer 570, a pixel-defining layer 590 may be formed. The pixel-defining layer 590 may include an organic material and/or an inorganic material to cover the pixel electrode 581 and the passivation layer 570. An opening is formed in the pixel-defining layer 590 to expose the pixel electrode 581.

Then, an intermediate layer 582 and an opposite electrode 583 are formed on at least the pixel electrode 581.

The pixel electrode 581 functions as an anode, and the opposite electrode 583 functions as a cathode. However, the polarities of the pixel electrode 581 and the opposite electrode 583 may be the opposite.

The pixel electrode 581 and the opposite electrode 583 are insulated from each other by the intermediate layer 582, and voltages of different polarities are applied to the intermediate layer 582 so that light is emitted from an organic emission layer.

The intermediate layer 582 may include the organic emission layer. According to another embodiment, the intermediate layer 582 may include the organic emission layer and may further include a hole injection layer (HL), a hole transport layer (HTL), an electron transport layer (ETL), and/or an electron injection layer (EIL).

According to the above-described embodiment, the organic emission layer includes emission material in each pixel. However, the present inventive concept is not limited thereto. In other embodiments, the organic emission layer may be commonly formed in all pixels, irrespective of locations of the pixels. In one embodiment, the organic emission layer may include vertically stacked or combined layers including emission materials emitting red, green, and blue color light. Also, the organic emission layer may have other color combinations which emit a white color light. In some embodiments, a color-conversion layer or a color filter that converts the emitted white color light into another color of light may be included.

After the display unit D is formed on the substrate 510, the encapsulation layer E may be formed on the display unit D. The encapsulation layer E may include a plurality of inorganic layers or may include an inorganic layer and an organic layer.

For example, the organic layer of the encapsulation layer E may include a polymer and may include a single layer or stacked layers including polyethylene terephthalate, a polyimide, a polycarbonate, an epoxy, polyethylene, and/or polyacrylate. In one embodiment, the organic layer may include polyacrylate. For example, the organic layer may include a polymerized monomer composition including a diacrylate-based monomer and a triacrylate-based monomer. The monomer composition may further include a monoacrylate-based monomer. Also, the monomer composition may further include a photoinitiator, such as TPO. However, the present invention is not limited thereto, and the monomer composition may include an epoxy, a polyimide, polyethylene terephthalate, a polycarbonate, polyethylene, and polyacrylate.

The inorganic layer of the encapsulation layer E may include a single layer or stacked layers including a metal oxide and/or a metal nitride. For example, the inorganic layer may include silicon dioxide ($SiO_2$), a silicon nitride ($SiN_x$), aluminum oxide ($Al_2O_3$), titanium dioxide ($TiO_2$), zirconium oxide ($ZrO_x$), and/or zinc oxide (ZnO).

An uppermost layer of the encapsulation layer E, which is exposed to the environment, may include an inorganic layer to prevent water penetration into the OLED.

The encapsulation layer E may include a sandwich structure in which at least one organic layer is inserted between at least two inorganic layers. As another example, the encapsulation layer E may include a sandwich structure in which at least one inorganic layer is inserted between at least two organic layers. For example, the encapsulation layer E may sequentially include a first inorganic layer U1, a first organic layer O1, a second inorganic layer U2, a second organic layer O2, a third inorganic layer U3, and a third organic layer O3 on the OLED in this order.

A halogenated metal layer including lithium fluoride (LiF) may further be included between the OLED and the first inorganic layer U1. The halogenated metal layer may prevent damage to the OLED when the first inorganic layer U1 is formed by sputtering.

An area (e.g., a surface area) of the first organic layer O1 may be smaller than an area (e.g., a surface area) of the second inorganic layer U2, and the area (e.g., the surface area) of the second organic layer O2 may be smaller than an area (e.g., a surface area) of the third inorganic layer U3.

However, the encapsulation layer E is not limited thereto and may include any suitable structure in which inorganic layers and organic layers are stacked in various orders.

The protective layer P may be formed on the encapsulation layer E. The protective layer P may be formed by various methods. For example, the protective layer P may be formed by sputtering, ion-beam deposition, evaporation, chemical vapor deposition, etc.

The protective layer P may include a metal-based oxide or nitride including $SiN_x$, $SiO_xN_y$, $TiO_x$, $TiN_x$, $TiO_xN_y$, $ZrO_x$, $TaN_x$, $TaO_x$, $HfO_x$, and $AlO_x$.

The protective layer P may be formed to completely cover or surround a side surface of the encapsulation layer E. Thus, the protective layer P may increase a life span of the encapsulation layer E by protecting the encapsulation layer E from water or oxygen.

The display apparatus 500 may be a flexible display apparatus and/or a rigid display apparatus.

As described above, according to one or more embodiments, the stage for cutting a substrate and the substrate-cutting apparatus may improve efficiency of a substrate cutting process by arranging openings of different sizes corresponding to areas of the substrate. The stage for cutting a substrate and the substrate-cutting apparatus may also improve the durability of the substrate that is cut by discharging impurities generated during the substrate cutting process via the discharge line.

It should be understood that the embodiments described herein should be considered in a descriptive sense only and not for purposes of limitation. Descriptions of features or aspects within each exemplary embodiment should typically be considered as available for other similar features or aspects in other exemplary embodiments. And while one or more exemplary embodiments have been described with reference to the figures, it will be understood by those of ordinary skill in the art that various changes in form and details may be made therein without departing from the spirit and scope as defined by the following claims and their equivalents.

What is claimed is:

1. A stage for cutting a substrate, the stage comprising:
   a plurality of cell areas, each of the cell areas comprising a first opening;
   an edge area at an outer side of the cell areas, the edge area comprising a second opening having a diameter that is larger than a diameter of the first opening;
   a dummy area between adjacent ones of the cell areas; and
   a cutting groove between one of the adjacent ones of the cell areas and the dummy area or between one of the cell areas and the edge area.

2. The stage of claim 1, further comprising a discharge line connected to the cutting groove,
   wherein the discharge line is configured to discharge impurities from the cutting groove.

3. The stage of claim 2, wherein the cutting groove is at opposite sides of the dummy area.

4. The stage of claim 2, wherein the discharge line extends along the cutting groove and is at an outer side of each of the cell areas.

5. The stage of claim 2, further comprising:
   a first suction space connected to the first opening at a side of the cell areas; and
   a second suction space connected to the second opening at a side of the edge area.

6. The stage of claim 5, wherein the discharge line is separated from the first suction space and the second suction space.

7. The stage of claim 1, wherein the dummy area comprises a third opening, and
   wherein the third opening has a diameter that is larger than the diameter of the first opening and smaller than the diameter of the second opening.

8. The stage of claim 7, further comprising a third suction space connected to the third opening at a side of the dummy area.

9. The stage of claim 1, wherein the edge area further comprises:
   a first slit extending along an outer side of the cell areas; and
   a second slit extending toward an outer side of the first slit.

10. The stage of claim 1, wherein an edge of at least one of the cell areas is devoid of a first opening.

11. A substrate-cutting apparatus comprising:
    a stage for accommodating a substrate, the stage comprising:
      a plurality of cell areas, each of the cell areas comprising a first opening;
      an edge area at an outer side of the cell areas, the edge area comprising a second opening having a diameter that is larger than a diameter of the first opening;
      a dummy area between adjacent ones of the cell areas; and
      a cutting groove between one of the adjacent ones of the cell areas and the dummy area or between one of the cell areas and the edge area; and
    a laser module for irradiating a laser beam onto the substrate,
    wherein the laser beam is irradiated onto the substrate along the cutting groove.

12. The substrate-cutting apparatus of claim 11, wherein the stage further comprises a discharge line connected to the cutting groove, and
    wherein the discharge line is configured to discharge impurities generated when the laser module irradiates the laser beam onto the substrate.

13. The substrate-cutting apparatus of claim 12, wherein the cutting groove is at opposite sides of the dummy area.

14. The substrate-cutting apparatus of claim 12, wherein the discharge line extends along the cutting groove and is at an outer side of each of the cell areas.

15. The substrate-cutting apparatus of claim 12, further comprising:
   a first suction space connected to the first opening at a side of the cell areas; and
   a second suction space connected to the second opening at a side of the edge area.

16. The substrate-cutting apparatus of claim 15, wherein the discharge line is separated from the first suction space and the second suction space.

17. The substrate-cutting apparatus of claim 11, wherein the dummy area comprises a third opening, and
   wherein the third opening has a diameter that is larger than the diameter of the first opening and smaller than the diameter of the second opening.

18. The substrate-cutting apparatus of claim 17, further comprising a third suction space connected to the third opening at a side of the dummy area.

19. The substrate-cutting apparatus of claim 11, wherein the edge area further comprises:
   a first slit extending along an outer side of the cell areas, and
   a second slit extending toward an outer side of the first slit.

20. The substrate-cutting apparatus of claim 11, wherein an edge of at least one of the cell areas is devoid of a first opening.

* * * * *